United States Patent [19]
Brock

[11] Patent Number: 5,990,650
[45] Date of Patent: Nov. 23, 1999

[54] METHOD AND APPARATUS FOR ORIENTING A DISK VIA EDGE CONTACT

[75] Inventor: Earl Brock, Alpharetta, Ga.

[73] Assignee: Lumonics Corporation, Oxnard, Calif.

[21] Appl. No.: 09/200,365

[22] Filed: Nov. 25, 1998

[51] Int. Cl.$^6$ ........................................... G05D 3/12
[52] U.S. Cl. ........................ 318/640; 108/146; 414/754; 414/783; 414/936; 414/941; 294/907
[58] Field of Search ..................... 318/640, 652; 33/1 M; 108/20, 144, 146; 294/119.1, 907; 414/736, 754, 774, 775, 776, 779, 781, 783, 784, 935, 936, 941; 901/46, 47

[56] References Cited

U.S. PATENT DOCUMENTS

| | | | |
|---|---|---|---|
| 5,054,991 | 10/1991 | Kato | 414/783 |
| 5,365,672 | 11/1994 | Kato | 33/520 |
| 5,452,078 | 9/1995 | Cheng | 356/150 |
| 5,520,501 | 5/1996 | Kouno et al. | 414/741 |
| 5,825,913 | 10/1998 | Rostami et al. | 382/151 |
| 5,905,850 | 5/1999 | Kavch | 395/94 |

*Primary Examiner*—Bentsu Ro
*Attorney, Agent, or Firm*—Freilich,Hornbaker & Rosen

[57] ABSTRACT

A method and apparatus for orienting a disk to precisely align a fiducial mark on the disk relative to an external reference point while gripping the disk only along its circumferential edge.

18 Claims, 9 Drawing Sheets

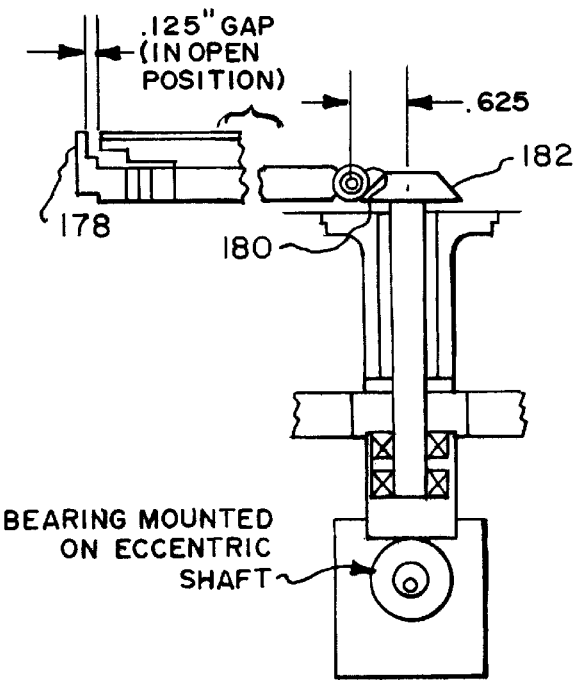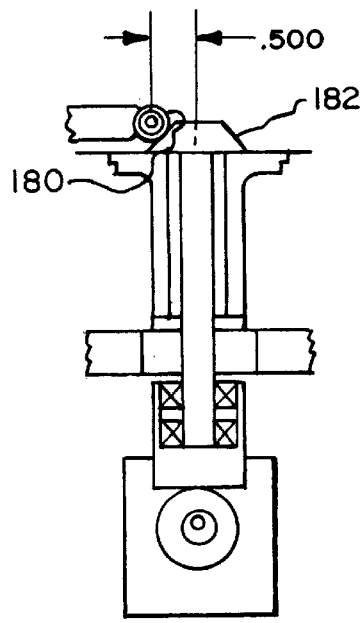
FIG. 9A.  FIG. 9B.
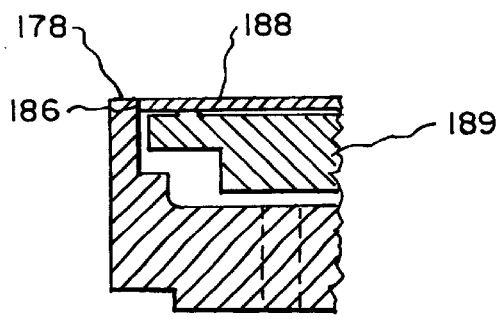
FIG. 10.

METHOD AND APPARATUS FOR ORIENTING A DISK VIA EDGE CONTACT

BACKGROUND OF THE INVENTION

This invention relates to a method and apparatus for orienting a disk (e.g., a silicon wafer) to precisely align a fiducial mark on the disk relative to a reference point external to the disk.

Various processes require the ability to rotationally position a disk to a known orientation. For example, in the fabrication of silicon wafers, in order to mark the disk in a particular location on the disk surface, it is necessary to precisely orient the disk relative to a marking device, e.g., a laser. Such applications may require very precise disk positioning while minimizing any contact with the disk surface. For example, published SEMI guidelines and specifications for silicon wafers used in the production of semiconductor chips appear to require that such wafers be manipulated only by its circumferential edge; see SEMI MI-0298 Specifications For Polished Monocystalline Silicon Wafers, which limits contact to an exclusion zone extending 3 mm from the wafer edge toward its center.

SUMMARY OF THE INVENTION

The present invention is directed to a method and apparatus for orienting a disk to precisely align a fiducial mark on the disk relative to an external reference point. More particularly, the invention relates to such a method and apparatus which grips the disk only along its circumferential edge.

In the fabrication of silicon wafers used to make semiconductor chips, it is frequently desirable to mark the wafer surface at a very precise location. It is also desirable to be able to orient the wafer relative to the marking device, e.g., a laser, without significantly contacting the wafer surface.

In accordance with a preferred embodiment of the invention, a chuck assembly is provided having multiple gripper fingers mounted for radial movement to enable them to clamp the disk along its circumferential edge. The chuck assembly is mounted for rotation to enable it to orient a clamped disk relative to an external reference point. Disks typically employed with embodiments of the invention carry a fiducial mark, e.g., an edge notch, which is used to orient the disk relative to an external reference point. A preferred system in accordance with the invention uses an imaging subsystem to locate the fiducial mark. More particularly, a preferred imaging system uses one or more cameras to image a profile of the disk edge. The image is then preferably computer analyzed to find the fiducial mark.

The imaging system is preferably also used to measure the disk diameter and location. If either parameter is out of tolerance, an error signal is generated.

Inasmuch as the gripper fingers can cover and conceal the fiducial mark, a preferred system in accordance with the invention provides for the chuck assembly to release the disk to allow it to be reoriented relative to the chuck assembly. More particularly, a preferred embodiment of the invention incorporates a mechanism for lifting the disk from the chuck assembly to allow the chuck assembly to be rotated relative to the disk prior to lowering the disk back onto the chuck assembly.

A preferred chuck assembly in accordance with the invention is comprised of three gripper arms displaced by 120° around the disk. Each arm carries a gripper finger at its outer end and is mounted for linear radial movement between a closed or clamped position in contact with the disk edge and an open or unclamped position spaced from the disk edge. The arms are simultaneously translated, inwardly or outwardly, by a moveable inclined plane engaged with surface followers carried on the arm inner ends.

In accordance with a further feature of the preferred embodiment, a spring mechanism simultaneously acts on the three gripper arms to force registration of the disk to an known repeatable position.

BRIEF DESCRIPTION OF THE FIGURES

FIGS. 9A and 9B respectively, show a gripper arm in an open (unclamped) and closed (clamped) position;

FIG. 10 is an enlarged sectional view showing the relationship between a wafer a gripper finger;

DETAILED DESCRIPTION

Figure 1A:
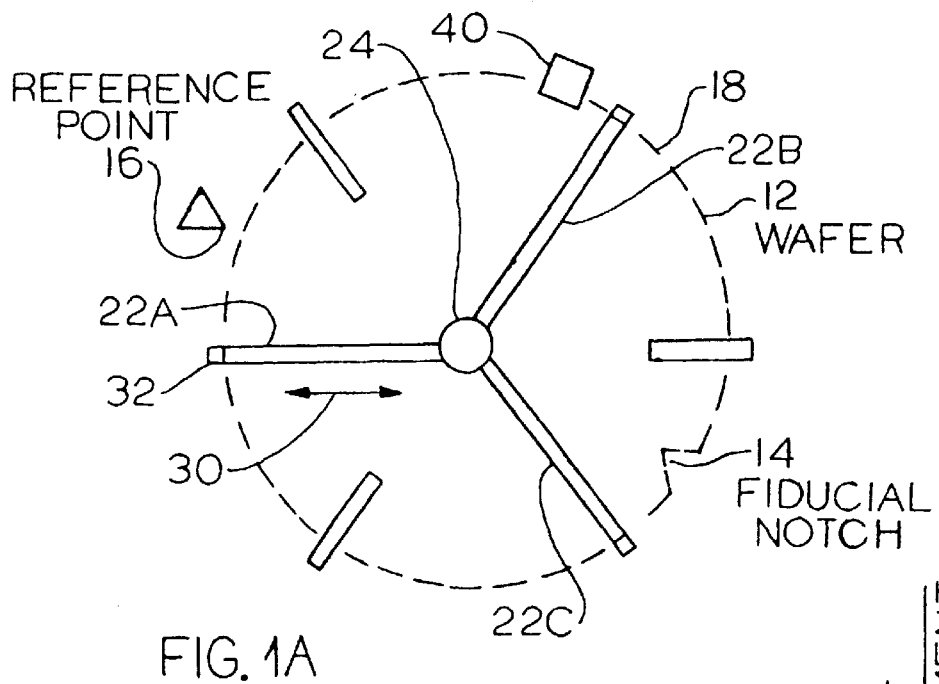
FIGS. 1A and 1B respectively comprise plan and front schematic illustrations of a disk orienting apparatus in accordance with the present invention.
Figure 1B:
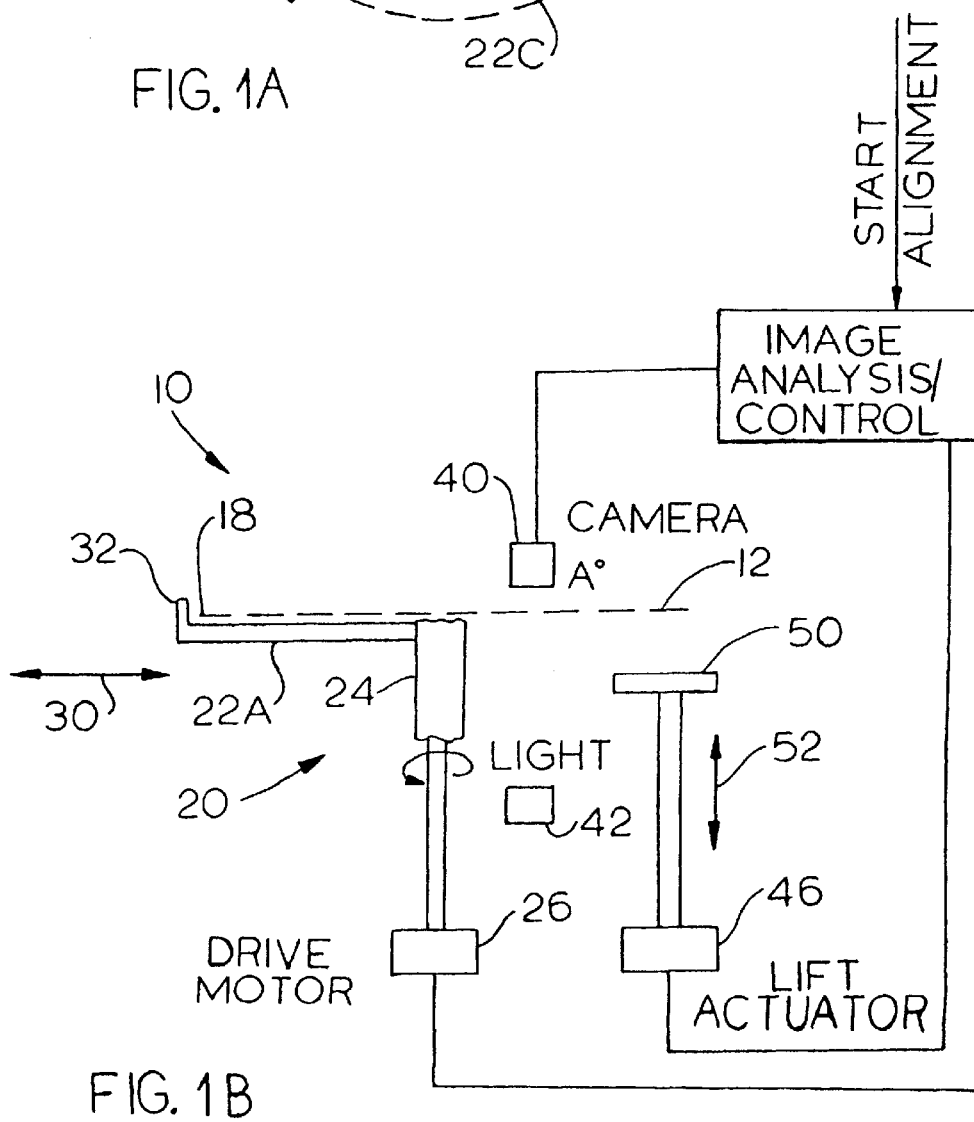

Attention is initially directed to FIGS. 1A and 1B which respectively show plan and front schematic views of a disk orienting apparatus 10 in accordance with the present invention. The intended primary function of the apparatus 10 is to orient a disk or wafer 12 to align a fiducial mark thereon, e.g., fiducial notch 14, with respect to an external reference point 16. A significant object of the invention is to be able to perform the aforestated primary function while engaging the wafer 12 only along its edge 18 in order to avoid damaging the wafer surface.

The apparatus 10 is generally comprised of a chuck assembly 20 which includes one or more gripper arms 22A, 22B, 22C. The gripper arms 22 are mounted to be rotated about an axis of rotation defined by chuck hub 24 driven by drive motor 26. As will be explained in detail hereinafter, each of the gripper arms 22 is mounted for translation radially with respect to the hub 24 as represented by double-sided arrow 30. Each of the gripper arms 22 moreover carries an upstanding gripper finger 32 at its outer end configured to engage the edge 18 of wafer 12.

Figure 2:
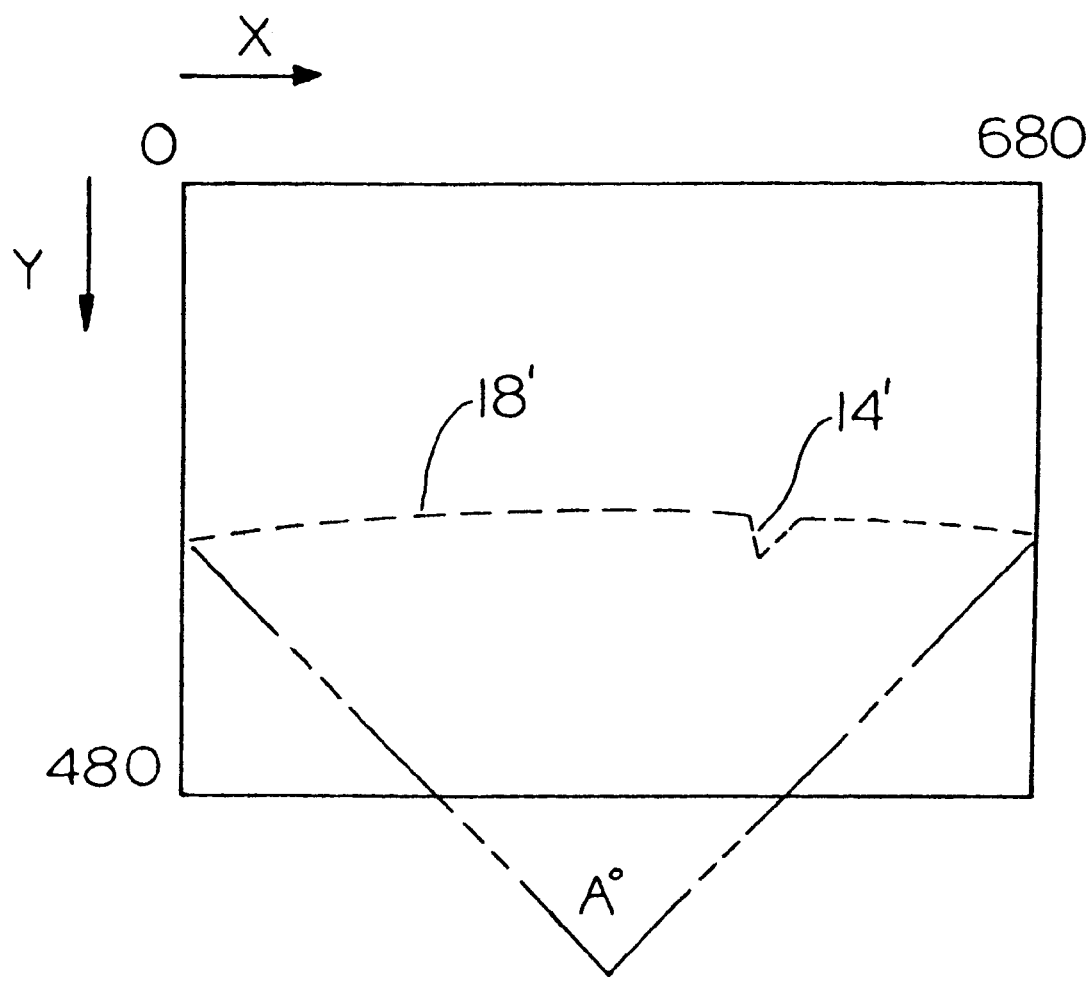
FIG. 2 is a schematic illustration of an edge profile image produced by a digital camera depicted in FIG. 1B.

In accordance with the invention, at least one imaging device 40, e.g., a camera, is mounted adjacent to the disk edge 18 above a light source 42 to optically view the disk edge and generate a digital representation of its profile, as depicted in FIG. 2. The camera 40 is connected to a microcomputer based controller processor 44 programed to perform image analysis and motor control. More particularly, as will discussed in connection with FIGS. 3A and 3B, the controller 44 processes the output of camera 40 to recognize the location of the fiducial notch 14. Based upon the analysis of the digital representation provided by camera 40, the controller 44 controls the aforementioned drive motor 26 as well as a lift 46 and a gripper motor, to be discussed hereinafter.

The camera 40 has a field of view of A°, which will hereinafter be assumed to be 10°. In order to enable a single camera 40 to image the entire 360° edge of the disk 12, it would be necessary during one complete cycle to successively step the edge 18 through thirty six 10° increments past the camera 40. However, as will be seen in the preferred embodiment depicted in FIG. 4, multiple cameras, e.g. 4, are used so that for each step, four separate images of 10° each can be processed by the computer 44. Thus, only nine steps would be required per cycle to view the entire 360° edge.

Because it is possible for the gripper fingers 32 to conceal the fiducial notch 14 from the camera 40 during an initial cycle, a mechanism is provided to modify the orientation between the disk 12 and chuck assembly 20 prior to executing a second cycle. As will be discussed, in order to do this, the arms 22 are first moved outwardly to an unclamped position and then the lift motor 46 is energized to move lift fingers 50 in a vertical direction as represented by double-sided arrow 52. The lift fingers 50 lift the disk 12 away from the chuck 20 enabling the chuck to be rotated by, e.g., 40°. The lift fingers 50 can then be lowered to place the disk 12 on back on the chuck where they are again clamped by the gripper arms 22 and gripper fingers 32 moving inwardly.

FIG. 2 schematically depicts the field of view of the camera 40 wherein the disk edge 18 is represented as $18^1$ and the fiducial notch 14 is shown as $14^1$. The image of course can be represented in many different formats, such as a table of digital values, Regardless, the edge of the wafer is defined as a vertical transition from light to dark inside the field of view. For every edge position along the x axis, there will be a single point defined by maximum light the variation between the pixel below and the pixel above.

$$P_g = [P_{x^n y-1} - P_{x^n y+1}] \max$$

The edge of the wafer at each columnar location of the image field will be referred to as $Y_x$ for all x values between 0 and n. In the preferred embodiment, the value for n will be assumed to be 680. However, n could be any value representing the number of physical columns in an image field used to locate the edge of the wafer. The range of Y values at columnar x position will be assumed to be in the range 0–480.

The fiducial notch is defined as the point fitting the minimum conditions described for the notch as:

$$Y_n > Y_{n+1} \text{ and } Y_{n+1} > Y_{n+2} \text{ and } Y_{n+2} > Y_{n+3} \text{ and } Y_n > Y_{n-1} \text{ and } Y_{n-1} > Y_{n-2} \text{ and } Y_{n-2} > Y_{n-3}$$

The series can extend beyond the range of plus or minus 3 from the apex of the notch depending on the configuration of the notch profile and its physical dimensions. If there are no locations in the edge profile Y which meet the criteria for the notch, then the notch is considered as Not Present in the image field of view.

The wafer diameter is related to the Y value of the wafer edge position at the x columnar position 300. The distance from the chuck axis to the edge of the wafer is defined as Wafer Radius=Radius Distance+(240−$Y[300]$)pixels*length units/pixel.

The Radius Distance is a fixed variable based upon the nominal dimension of a known diameter wafer and is assumed to be a constant for all wafers to be processed by the apparatus 10.

The Wafer location is defined as the center of the wafer based upon the location of the edge of the wafer under each of the inspection cameras. For a four camera system, the Wafer location coordinates $X_{wafer}$, $Y_{wafer}$ is determined by:

$$Y_{wafer} = (240 - Y_{cam0}) - (240 - Y_{cam2}).$$

The X position of the wafer is defined as $$X_{wafer} = (240 - Y_{cam1}) - (240 - Y_{cam3}).$$

Figure 3A:
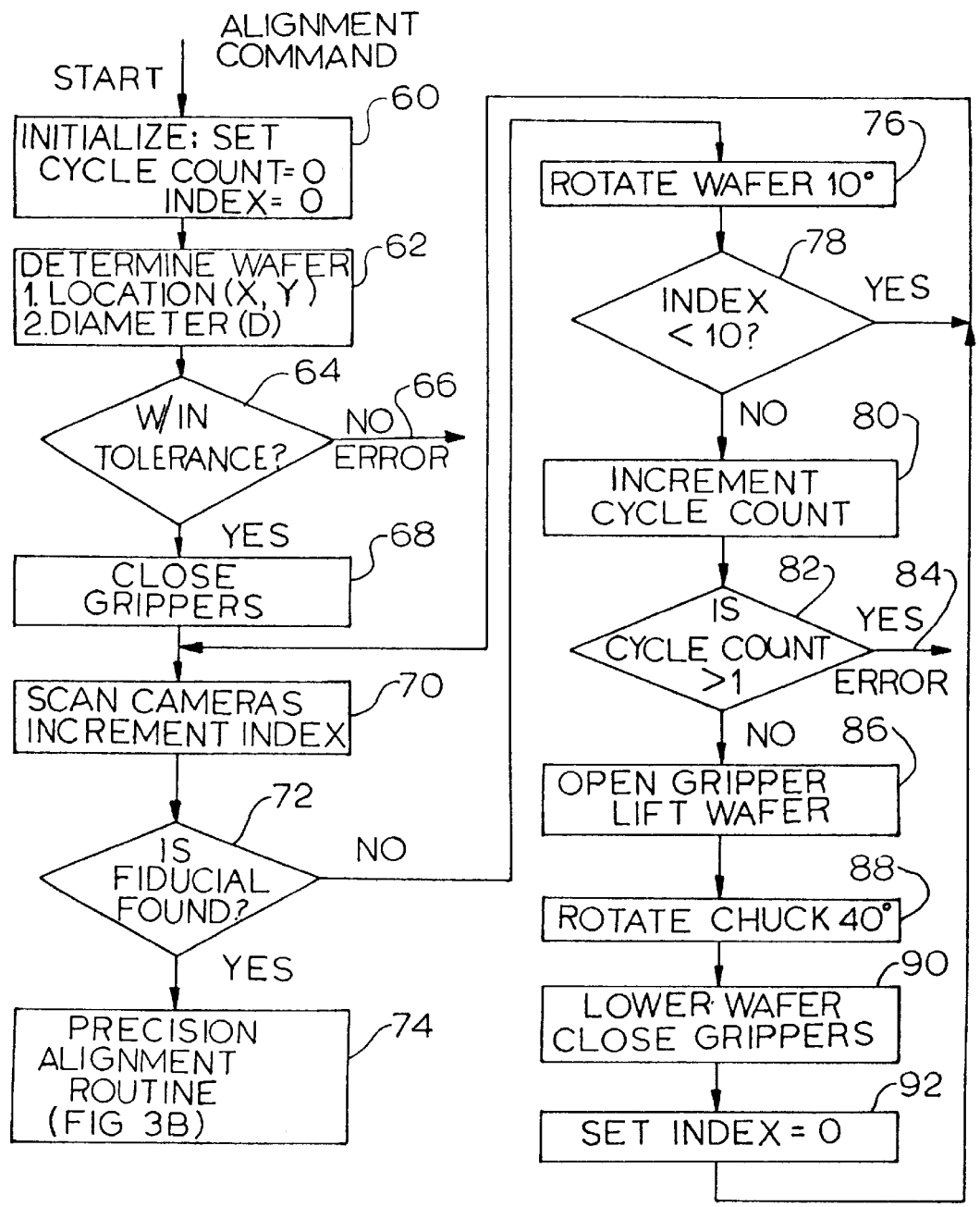
FIG. 3A is a flow chart depicting the operational sequence of an apparatus in accordance with the invention.
Figure 3B:
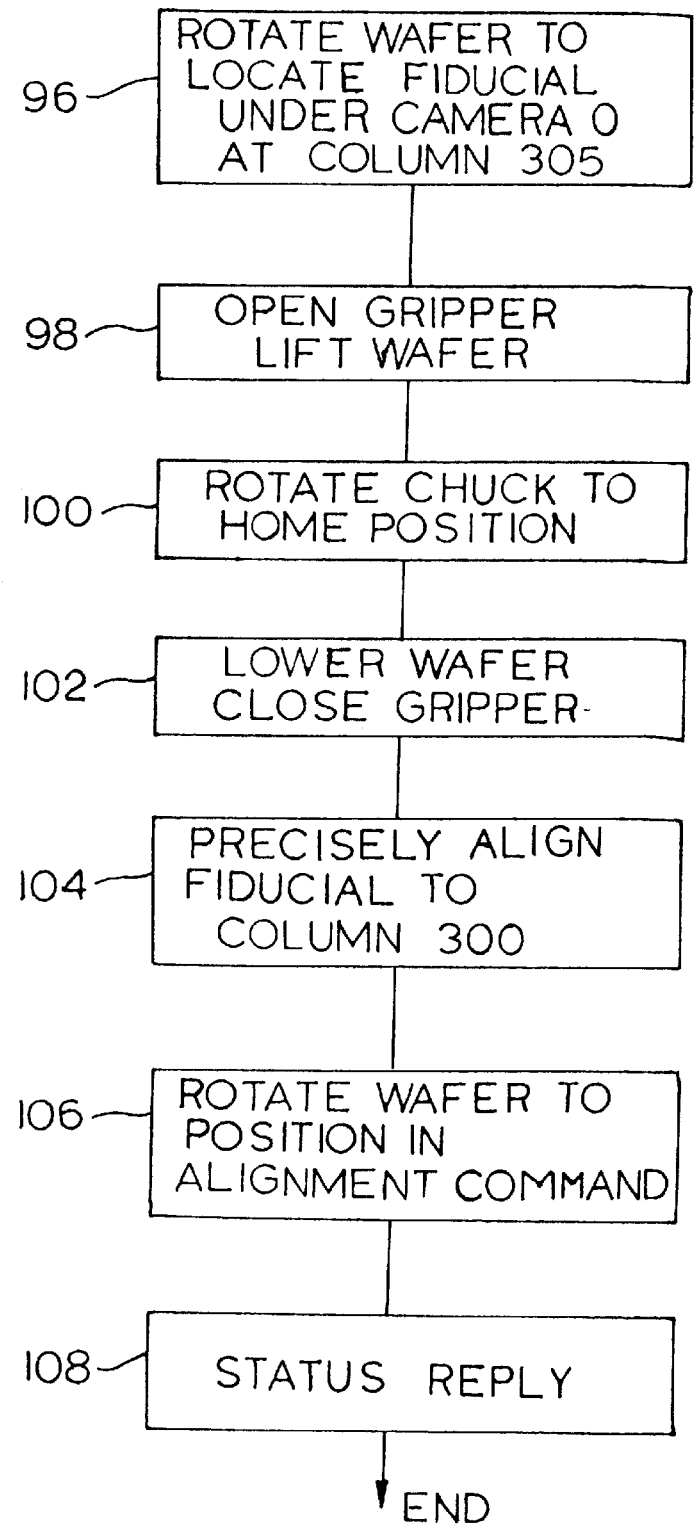
FIG. 3B is a flow chart depicting in more detail the precision alignment procedure depicted in FIG. 3A.

Attention is now directed to the flow chart of FIGS. 3A and 3B which generally describes the operation of the controller 44 to perform image analysis and system control. The sequence of FIG. 3A is initiated by a host system controller (not shown) issuing a START ALIGNMENT command. It will be assumed prior to the issuance of the START ALIGNMENT command that a wafer 12 has been placed on the chuck 20 by some external means such as a robot or human operator.

Block 60 of the flow chart calls for the execution of an initialize routine involving setting both the Cycle Count and the Index to 0. Block 62 is then executed to determine the wafer location and wafer diameter as aforedescribed. Decision block 64 then determines whether the location and diameter are within tolerance. If no, then an error signal is generated via line 66. If yes, then in block 68 the gripper arms 22 are moved radially inwardly to clamp the gripper fingers 32 against the wafer edge 18. In block 70 the controller 44 scans the digital representations respectively produced by cameras 40 to locate the fiducial mark. Also, the Index is incremented. Decision block 72 then asks, has the fiducial mark been found? If yes, then operation proceeds to a precision alignment routine represented by block 74 and depicted in greater detail in FIG. 3B. If no, then operation proceeds to block 76 in which the chuck is rotated to rotate the wafer by 10° relative to the camera 40. Next, decision block 78 asks whether the Index is less than 10? If yes, operation loops back to block 70 to enable each camera to scan another 10° of the wafer edge. If decision block 78 determines that the index is not less than 10, meaning that the four cameras have already scanned nine 10° increments, then operation proceeds to block 80. It should be understood that operation proceeds to block 80 only in the event that the system has failed to find the fiducial notch in the initial cycle during which the system viewed all 360° of the wafer edge. This situation will occur if the gripper fingers 32 conceal the fiducial notch from the camera 40. In order to locate the notch, the relative orientation between the wafer 12 and the chuck is modified and then a new cycle of scans is initiated. Thus, after the cycle count is incremented in block 80, decision block 82 asks, is the Cycle Count greater than 1, meaning have we already performed cycle counts 0 and 1? If yes, then an error signal is generated via line 84. If no, the gripper arms are opened and the wafer is lifted in block 86.

The chuck is then rotated by 40° in block 88. The wafer is then lowered back onto the chuck and the gripper arms are closed, represented in block 90. In block 92 the Index is set back to 0 and operation loops back to block 70 to initiate a second cycle of scans.

Attention is now directed to FIG. 3B which represents the precision alignment routine 74. In block 96 the wafer is rotated to position the previously located fiducial notch under a selected one of the cameras, e.g., camera 0, between columns (x) 304 and 306. In block 98 the gripper arms are opened and the lift mechanism is energized to lift the wafer off the chuck. In block 100 the chuck is rotated to its home position. In block 102 the wafer is lowered and the gripper arms are closed to clamp the wafer. In block 104 the chuck is rotated to now precisely align the fiducial notch to column 300. In block 106 the chuck is rotated to align the notch to the position defined by the START ALIGNMENT command. After this is done, block 108 then returns a successful alignment status reply to the host controller.

Figure 4:
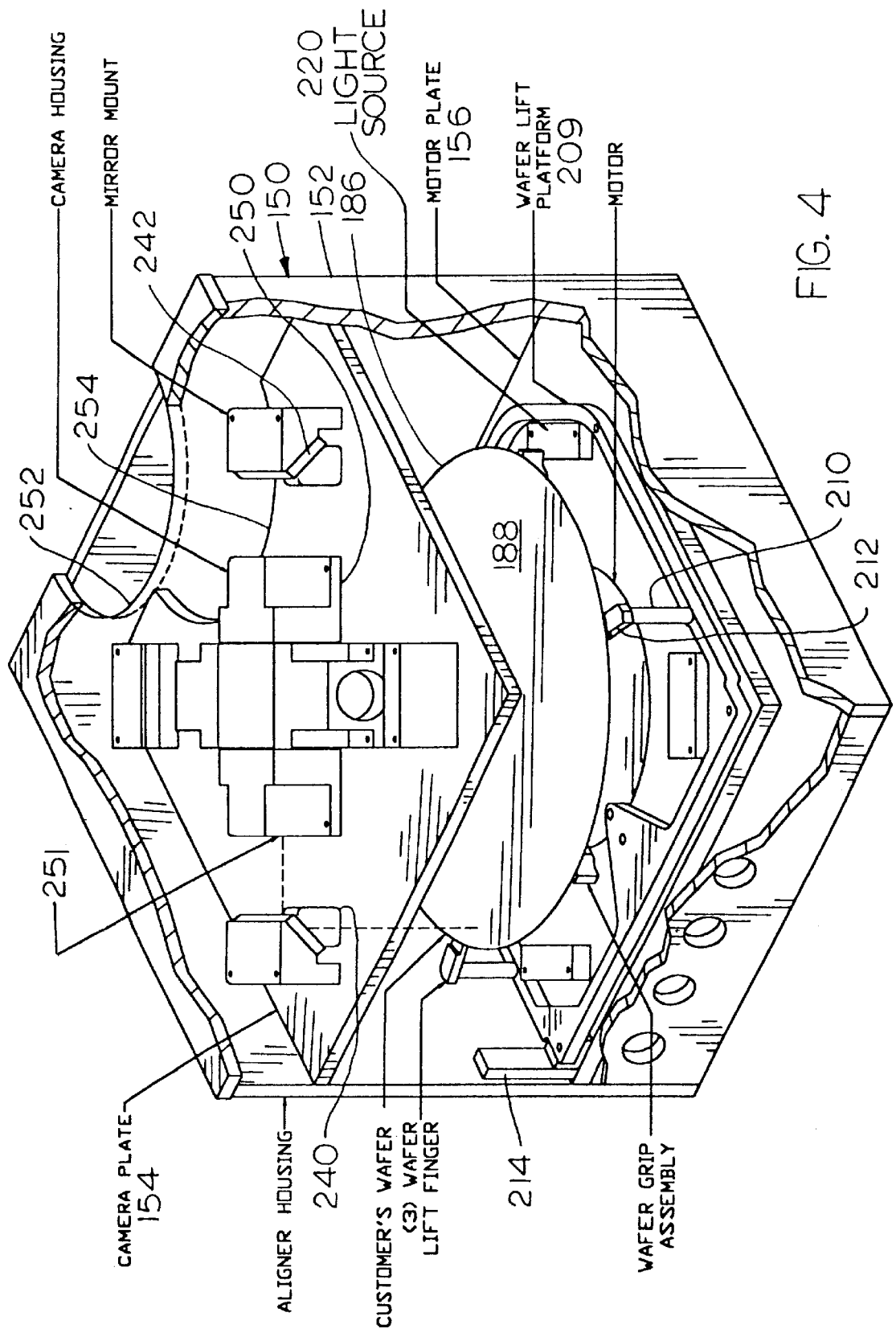
FIG. 4 is a cut away isometric view of a preferred disk orienting apparatus in accordance with the present invention.
Figure 5:
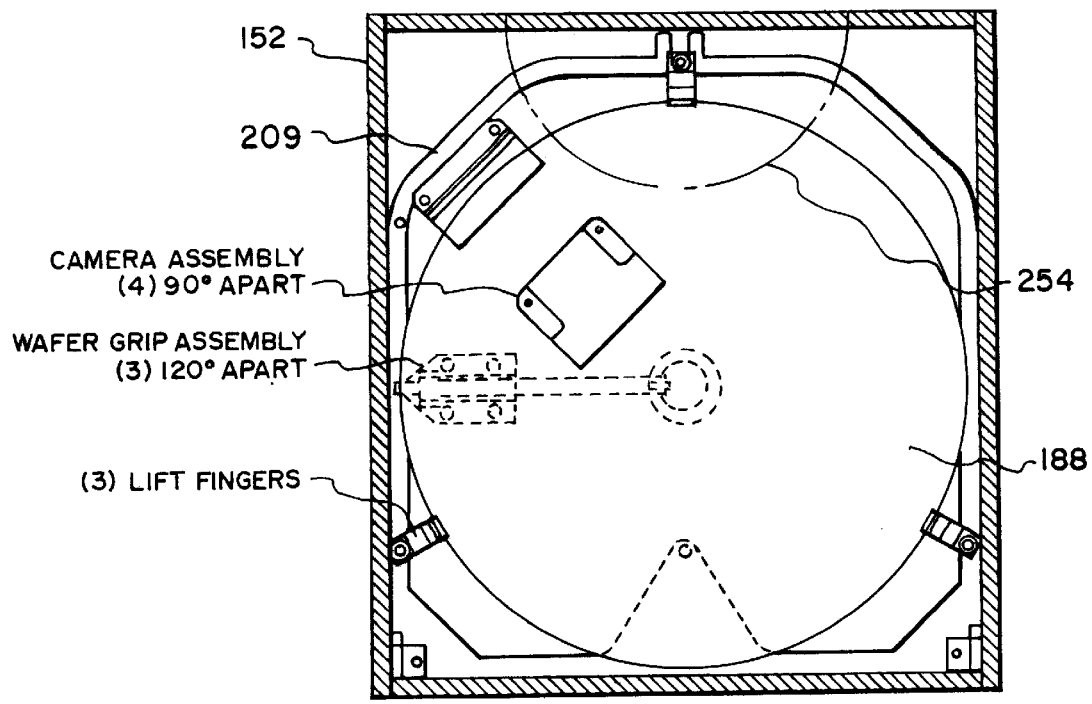
FIG. 5 is a sectional plan view of the apparatus of FIG. 4.
Figure 6:
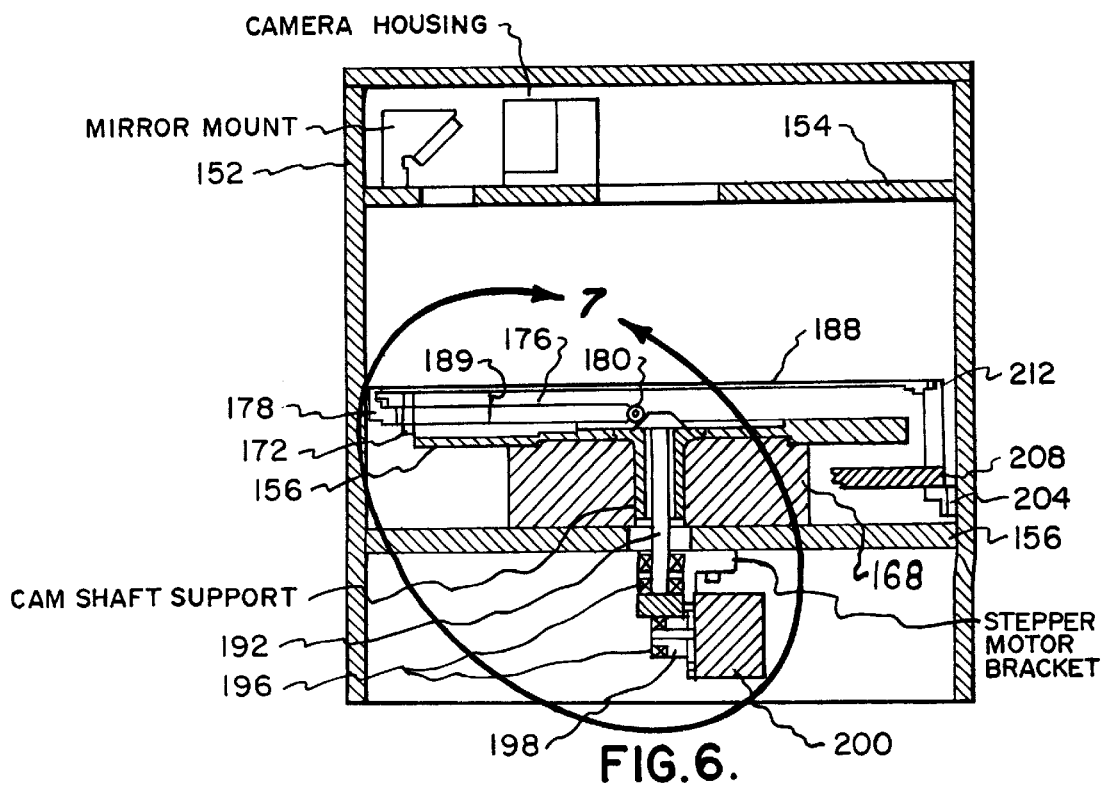
FIG. 6 is a sectional front view of the apparatus of FIG. 4.

Attention is now directed to FIG. 4 which illustrates an isometric cut-away view of a preferred apparatus 150 in accordance with the present invention. The apparatus 150 comprises a rectangular housing 152 defining an internal volume partitioned by a horizontally oriented camera plate 154 and a horizontally oriented motor plate 156.

Figure 7:
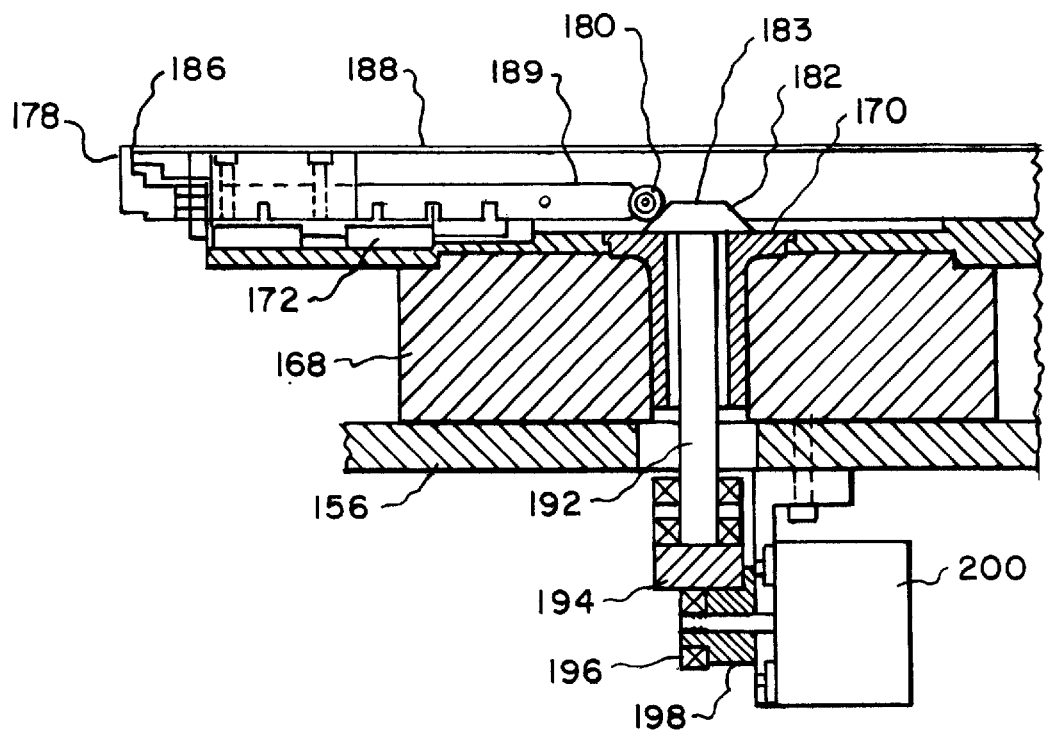
FIG. 7 is an enlarged sectional view depicting the chuck assembly of the apparatus of FIG. 4.
Figure 8:
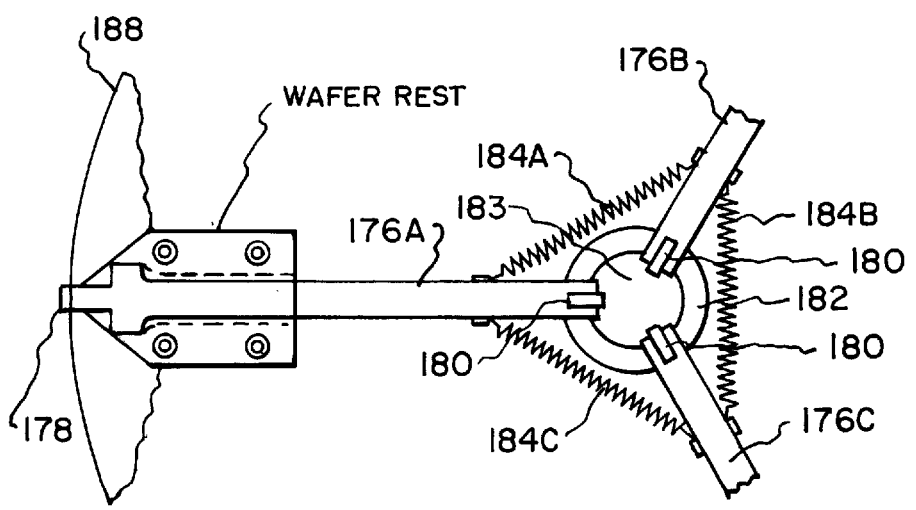
FIG. 8 is a plan view showing the spring mechanism acting on the chuck gripper arms.

As is best seen in FIGS. 7 and 8, the motor plate 156 supports a chuck drive motor 168. The drive motor 168 drives a central hub 170 for rotation about its axis. Extending radially from the hub 170 are three linear bearings 172, each for mounting a different gripper arm 176 for translational movement radially with respect to the hub 170 toward and away from the hub 170 axis. Each gripper arm 176 includes an upstanding gripper finger 178 at its outer end. A follower in the form of a roller bearing 180 is mounted on the inner end of each gripper arm 176 to bear against an inclined plane 182 on member 183.

As is best shown in FIG. 8, a spring mechanism urges the roller bearing followers 180 on each gripper arm against the inclined plane 182. Note that the spring mechanism includes springs 184A connecting arm 176A to arm 176B, spring 184B connecting arm 176B to arm 176C, and spring 184C connecting arm 176C to 176A. These springs act on the arms 176 to urge their respective roller bearing followers 180 against the inclined plane 182, pulling the arms and gripper fingers inwardly to clamp against the edge 186 of a wafer 188 supported on wafer rests 189 as depicted in FIGS. 7 and 10. The wafer rests 189 preferably support the wafer 188 within 3 millimeters of the wafer edge. The springs 184A, 184B, 184C are preferably unbalanced (e.g. 184A exerts a greater force than the other springs) to allow at least one point on the wafer edge to be pulled to a known repeatable position.

By moving the inclined plane 182 vertically upwardly, as represented in FIG. 9A, the bearing followers 180 and their respective arms 176 will be moved radially outwardly to open the chuck gripper fingers and unclamp the disk 188. The inclined plane member 183 is mounted on and secured to a vertical shaft 192 extending through hub 170 and terminating at lower bearing 194. The bearing 194 engages the cam bearing 196 carried by an eccentric shaft 198 of a gripper stepper motor 200. Rotation of the eccentric shaft moves the vertical shaft 192 vertically to move the inclined plane 182 relative to the roller bearing followers 180. In this manner the gripper arms 176 and respective gripper fingers 178 are moved outwardly to unclamp the edge 186 of wafer 188. FIG. 9A depicts the position of the roller bearing follower 180 on the inclined plane 182 for the open position of the gripper fingers FIG. 9B depicts the radially inward position of the bearing followers 180 on the inclined plane 182 associated with the closed or clamped position of the gripper fingers.

Figure 11:
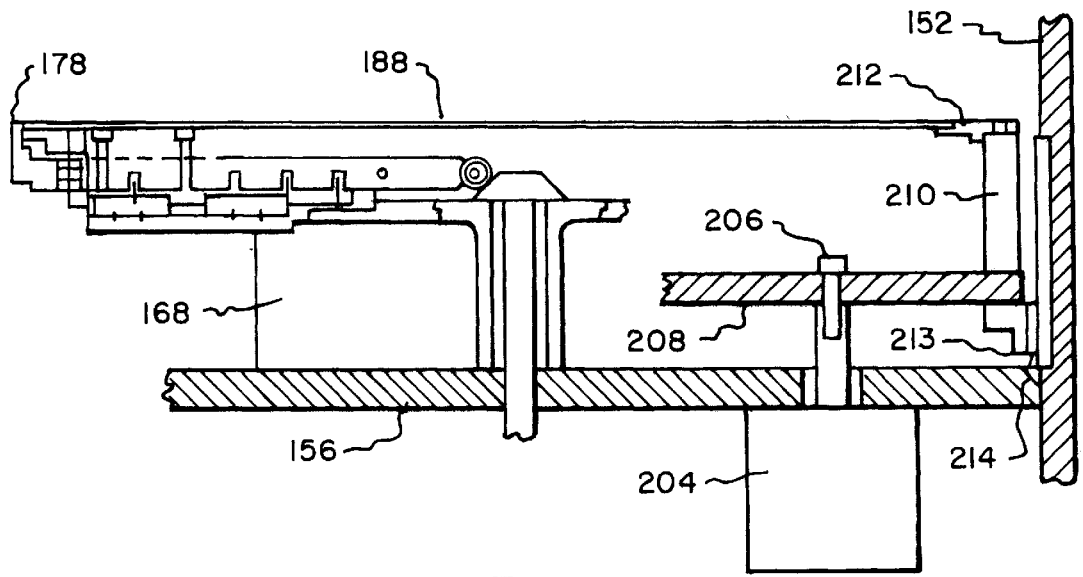
FIG. 11 is an enlarged sectional view depicting the operation of the lift mechanism.
Figure 12:
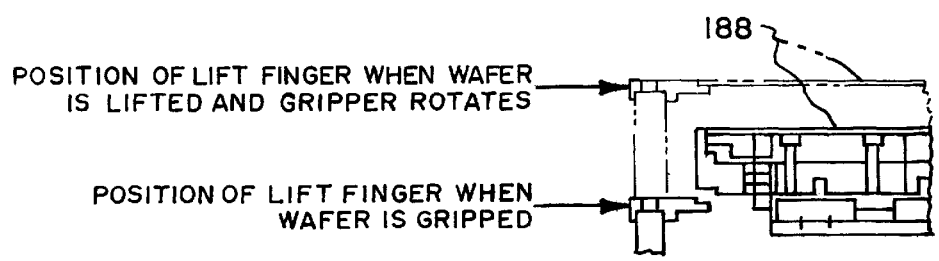
FIG. 12 depicts the respective positions of the lift mechanism when the disk is resting on the chuck and when the disk is lifted, i.e. displaced, from the chuck.

In addition to the gripper stepper motor 200 and drive motor 186, a lift actuator 204 is suspended beneath the motor plate 156. The lift actuator 204 has a lift tongue 206 extending through the motor plate for vertical movement. A lift guide 213 is coupled to a lift plate 208 which carries vertical lift arms 210 terminating in lift fingers 212. The lift arms 210 are supported for sliding movement in bearing 214 mounted on the side wall of housing 152, as is depicted in FIG. 11 to assure linear movement of plate 208. Note particularly the position of the lift finger in FIG. 11 engaging the undersurface of wafer 188 and about to lift the wafer 188 above the gripper fingers 178. FIG. 12 shows the two positions of the lift finger, i.e., (1) when the wafer is clamped and the lift finger is in its lowered position and (2) when the lift finger is raised from the chuck to permit the chuck to rotate relative to the wafer. The aforementioned lift plate 208 preferably comprises an open frame or platform 209 as shown in FIG. 4 for supporting the lift arms 210 and fingers 212. Diffused light sources 220 are mounted on the upper surface of motor plate 156 as shown in FIG. 4, placed within the periphery of the lift platform frame 209. The diffused light sources are mounted substantially in alignment with the edge 186 of wafer 188. In the preferred embodiment, four diffuser light sources 220 are mounted on the motor plate 156 displaced around the central axis of drive motor 168 by substantially 90°.

The aforementioned camera plate 154 defines four openings 240 respectively substantially aligned with the four light sources 220 carried by the motor plate 156. A different mirror 242 is mounted adjacent each of the openings 240 to reflect light from its associated light source 220 to a camera 250 mounted on the camera plate 154. As mentioned, in accordance with the preferred embodiment four cameras 250 are provided. The four cameras 250 are carried by camera plate 154 respectively facing a different one of the mirrors 242. Thus, the four cameras are respectively looking at four different portions of the wafer edge displaced by 90°.

Note that the top wall 250 of the housing 152 is cut-away at 252 in alignment with a similar cut-away 254 in camera plate 154. The respective cut-outs 252 and 254 provide access to the upper surface of wafer 188 to permit a tool, e.g. a laser, to mark the wafer surface.

From the foregoing, it should be apparent that an apparatus and method have been described herein for finding a fiducial mark on a disk by analyzing a digital representation of a disk edge profile for the purpose of orienting the disk relative to a reference point. Although a preferred embodiment has been shown and described, it is recognized that many modifications and variations will occur to those skilled in the art falling within the spirit and intended scope of the invention as defined by the following claims.

I claim:

1. An apparatus for orienting a disk to position a fiducial mark thereon relative to an external reference point, said apparatus comprising:

a chuck defining a rotational axis and including means for supporting a disk perpendicular to said axis, said chuck including at least one gripper member selectively movable between (1) an unclamped position displaced from the edge of said disk and (2) a clamped position engaging said disk edge to clamp said disk to said chuck;

an image processor for locating the fiducial mark on said disk; and a drive motor selectively actuatable to rotate said chuck in said clamped position to orient said disk to align said fiducial mark relative to an external reference point.

2. The apparatus of claim 1 wherein said image processor includes imaging means for generating a digital representation of the edge profile of said disk and processor means for processing said digital representation to locate said fiducial mark.

3. The apparatus of claim 2 further including a controller responsive to said image processor for actuating said drive motor.

4. The apparatus of claim 1 wherein said gripper member is mounted for translation radially with respect to said disk.

5. The apparatus of claim 4 further including an inclined plane engaged against said gripper member; and a gripper motor for moving said inclined plane parallel to said axis to translate said gripper member.

6. The apparatus of claim 1 wherein said drive motor is selectively actuatable to rotate said chuck in said unclamped position to modify the relative orientation of said disk to said chuck.

7. The apparatus of claim 1 further including a decoupling mechanism selectively actuatable to displace said disk from said chuck; and wherein said drive motor is selectively actuatable to rotate said chuck relative to said displaced disk.

8. The apparatus of claim 7 wherein said mechanism includes a lift member mounted for selective movement parallel to said axis for lifting said disk from said chuck.

9. The apparatus of claim 1 wherein said chuck includes first, second, and third gripper members displaced around said axis, each gripper member comprising a gripper arm having inner and outer ends and mounted for translation radially with respect to said axis;

each of said gripper arms having a gripper finger at the outer end thereof and a follower at the inner end thereof;

an inclined plane;

spring means for urging said followers against said inclined plane; and a gripper motor for selectively moving said inclined plane parallel to said axis to translate said gripper arms radially with respect to said axis.

10. The apparatus of claim 9 wherein said spring means include first, second and third springs respectively coupling said first, second, and third gripper arms to said second, third, and first gripper arms.

11. A system for orienting a disk having a fiducial edge notch comprising:

a chuck mounted for rotary motion around a defined axis, said chuck including at least one gripper member selectively actuatable to either clamp or unclamp said disk;

an image processor including at least one camera for generating a digital representation of the edge profile of said disk and computer means for processing said digital representation to locate said fiducial notch;

a drive motor controlled by said computer means for rotating said chuck to orient said fiducial notch relative to a reference point.

12. The system of claim 11 wherein said image processor is operable to determine the location of the wafer center; and wherein said computer means is operable to generate an error signal when the determined location is out of tolerance.

13. The system of claim 11 wherein said image processor is operable to measure the diameter of said disk; and wherein said computer means is operable to generate an error signal when said measured diameter is out of tolerance.

14. The system of claim 11 wherein said camera has a view field equal to A°; and wherein said system further includes:

means for incrementally rotating said disk relative to said camera by substantially A° increments in order to locate said fiducial notch.

15. The system of claim 11 including a selectively actuatable decoupling mechanism for modifying the relative orientation of said disk to said chuck.

16. The system of claim 15 wherein said decoupling mechanism includes a lift member mounted for movement parallel to said axis for lifting said disk from said chuck.

17. A method of locating a fiducial edge notch on a disk and orienting said disk to position said notch relative to a reference point, said method including;

optically viewing said disk edge to generate a digital representation thereof;

processing said digital representation to locate said notch;

clamping said disk by engaging the edge thereof; and rotating said clamped disk to position said notch to a reference point.

18. The method of claim 17 wherein said clamping step includes engaging gripper fingers mounted to translate radially with respect to said disk against said disk edge; and including the further steps of:

selectively decoupling said disk from said gripper fingers to reorient said disk relative thereto.

* * * * *